United States Patent
Oh et al.

(10) Patent No.: US 8,018,787 B2
(45) Date of Patent: Sep. 13, 2011

(54) SEMICONDUCTOR MEMORY DEVICE CAPABLE OF CONTROLLING A SUPPLY CURRENT OF A MEMORY CELL AND METHOD THEREOF

(75) Inventors: Young-Hoon Oh, Gyeonggi-do (KR); Sung-Yeon Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 43 days.

(21) Appl. No.: 12/492,434

(22) Filed: Jun. 26, 2009

(65) Prior Publication Data
US 2010/0309718 A1 Dec. 9, 2010

(30) Foreign Application Priority Data
Jun. 5, 2009 (KR) .................... 10-2009-0049823

(51) Int. Cl.
*G11C 7/00* (2006.01)
(52) U.S. Cl. .............. 365/211; 365/158; 365/189.09
(58) Field of Classification Search .............. 365/158, 365/189.09, 211
See application file for complete search history.

(56) References Cited

U.S. PATENT DOCUMENTS

| 7,203,090 | B2 | 4/2007 | Hayakawa | |
|---|---|---|---|---|
| 7,224,601 | B2 | 5/2007 | Panchula | |
| 2004/0141370 | A1* | 7/2004 | Tran et al. | 365/158 |
| 2004/0252551 | A1* | 12/2004 | Iwata et al. | 365/158 |
| 2005/0036362 | A1* | 2/2005 | Iwata et al. | 365/158 |
| 2010/0091562 | A1* | 4/2010 | Chen et al. | 365/171 |

FOREIGN PATENT DOCUMENTS
KR 1020030045639 6/2003

OTHER PUBLICATIONS

Notice of Preliminary Rejection issued from Korean Intellectual Property Office on Jan. 6, 2011.

* cited by examiner

*Primary Examiner* — Hoai V Ho
(74) *Attorney, Agent, or Firm* — IP & T Group LLP

(57) ABSTRACT

A semiconductor memory device uses a magnetic tunnel junction device (MTJ) and includes a memory cell connected between a first driving line and a second driving line and configured to store data having a data state that is determined based on a direction of a current flowing through the first and the second driving lines, and a current controlling block configured to control a supply current provided to the first and second driving lines in response to temperature information in a writing operation.

5 Claims, 11 Drawing Sheets ured, the transistor TR is
SEMICONDUCTOR MEMORY DEVICE CAPABLE OF CONTROLLING A SUPPLY CURRENT OF A MEMORY CELL AND METHOD THEREOF

CROSS-REFERENCE TO RELATED APPLICATIONS

The present application claims priority of Korean Patent Application No. 10-2009-0049823, filed on Jun. 5, 2009, the disclosure of which is incorporated herein by reference in its entirety.

BACKGROUND OF THE INVENTION

The present invention relates to semiconductor design technology, and more particularly, to a semiconductor memory device using a magnetic tunnel junction element (MTJ).

In general, a dynamic random access memory (DRAM) device and a static random access memory (SRAM) device are volatile memory devices and thus have a disadvantage of losing data stored in memory cells when power to the device is turned off. Therefore, recently, researches for nonvolatile memory devices have been actively made. A magnetic random access memory (MRAM) device is a type of a magnetic memory device. In particular, the MRAM device has a nonvolatile characteristic and can achieve high integration. Furthermore, the MRAM device can perform a high-speed operation and has a low power consumption characteristic. Therefore, the MRAM has attracted considerable attention as a next generation semiconductor memory device.

A memory cell of the MRAM device includes one transistor for performing a switching operation in response to addresses provided from the outside and a magnetic tunnel junction element (MTJ) for storing information. The MTJ, which is a type of magnetic memory elements, has magneto-resistance (MR) varying according to a magnetization direction of two ferromagnetic substances. The MRAM device determines whether data stored in the MTJ is logical high state '1' or logical low stage '0' by detecting the variation of the magneto-resistance.

FIG. 1 illustrates a structure of a memory cell of a typical semiconductor memory device.

Referring to FIG. 1, the memory cell includes one transistor TR and one magnetic tunnel junction element MTJ.

The transistor TR performs a switching operation in response to addresses in an active operation. Thus, the transistor TR includes a source-drain path between a source line SL and the magnetic tunnel junction element MTJ, and a gate connected to a word line WL. As a result, the transistor TR is turned on/off according to whether the word line WL is activated or not.

The magnetic tunnel junction element MTJ includes a free layer 130A, a tunnel insulation layer 130B and a pinned layer 130C. Herein, the free layer 130A is formed of a ferromagnetic substance and its magnetization direction is changed by external impulse, e.g., a current applied to the magnetic tunnel junction element MTJ. The pinned layer 130C has a magnetization direction that is not changed by the external impulse. For illustration purposes, the magnetization direction of the pinned layer 130C is determined by a pinning layer (not shown) formed of an antiferromagnetic substance. The tunnel insulation layer 130B may be formed of a magnesium oxide (MgO) layer.

A tunnel current flows through the magnetic tunnel junction element MTJ according to voltages coupled to both ends of the magnetic tunnel junction element MTJ, and a magnetization direction of the free layer 130A is determined according to a direction of the tunnel current. In case where the magnetization direction of the free layer 130A is consistent with that of the pinned layer 130C, the resistance of the magnetic tunnel junction element MTJ is comparatively low. On the other hand, in case where the magnetization direction of the free layer 130A is not consistent with that of the pinned layer 130C, the resistance of the magnetic tunnel junction element MTJ is comparatively high (for example, to be higher than the comparatively low resistance). In general, a state that the magnetization direction of the free layer 130A is consistent with that of the pinned layer 130C corresponds to data '0' and its opposite state corresponds to data '1'.

FIGS. 2A and 2B illustrate views for explaining a data writing operation of the magnetic tunnel junction element MTJ described in FIG. 1. FIG. 2A shows an operation of writing data '0' to the magnetic tunnel junction element MTJ and FIG. 2B describes an operation of writing data '1' to the magnetic tunnel junction element MTJ. For illustration purposes, it is assumed that the word line WL is activated. In this case, the magnetic tunnel junction element MTJ is included in a current path connecting the bit line BL and the source line SL.

First of all, the operation of writing the data '0' to the magnetic tunnel junction element MTJ is described with reference to FIGS. 1 and 2A.

In the operation of writing the data '0', a write driving circuit (not shown) drives the bit line BL with a write supply voltage and the source line SL with a ground voltage VSS. In other words, in the operation of writing the data '0', a predetermined voltage greater than a certain level is supplied to the free layer 130A to be higher than that of the pinned layer 130C so that a current higher than a critical current is generated in a direction of the bit line BL-> the magnetic tunnel junction element MTJ-> the source line SL. In this case, the magnetization direction of the free layer 130A is the same as that of the pinned layer 130C. That is, the resistance of the magnetic tunnel junction element MTJ is decreased and the operation of writing the data '0' is completed.

Then, the operation of writing the data '1' to the magnetic tunnel junction element MTJ is described with reference to FIGS. 1 and 2B.

In the operation of writing the data '1', contrary to the operation of writing the data '0', a predetermined voltage greater than a certain level is supplied to the pinned layer 130C to be higher than that of the free layer 130A so that a current higher than a critical current is generated in a direction of the source line SL-> the magnetic tunnel junction element MTJ-> the bit line BL. In this case, the magnetization direction of the free layer 130A is opposite to that of the pinned layer 130C. That is, the resistance of the magnetic tunnel junction element MTJ is comparatively high and the operation of writing the data '1' is completed.

FIG. 3 illustrates a graph showing a tunnel magneto-resistance (TMR) characteristic according to temperature and voltage of the magnetic tunnel junction element MTJ illustrated in FIG. 1.

As can be seen from FIG. 3, the magnetic tunnel junction element MTJ has hysteresis and two stable states, i.e., a low resistance state and a high resistance state, according to the critical current flowing through the current path including the magnetic tunnel junction element MTJ and the direction of the critical current. The stable states are maintained although power to the device is turned off. Thus, the semiconductor memory device secures the nonvolatile characteristic of the data stored therein.

Meanwhile, a switching current of the magnetic tunnel junction element MTJ generally varies according to the temperature. Herein, the switching current means a current at a point where data '0' or '1' is written to the magnetic tunnel junction element MTJ. As can be seen from a region indicated by a dotted line in FIG. 3, the switching current of the magnetic tunnel junction element MTJ is comparatively low in the high temperature, e.g., 70° C., whereas it is comparatively high in the low temperature, e.g., 0° C. This characteristic of the magnetic tunnel junction element MTJ induces an unstable writing operation according to process, voltage and temperature (PVT).

SUMMARY OF THE INVENTION

An embodiment of the present invention is directed to providing a semiconductor memory device capable of controlling a supply current provided to a magnetic tunnel junction element (MTJ) in a data writing operation according to temperature.

Another embodiment of the present invention is directed to providing a semiconductor memory device capable of controlling a supply voltage applied to a bit line and a source line in a data writing operation according to temperature.

Still another embodiment of the present invention is directed to providing a semiconductor memory device capable of controlling an amount of a driving current flowing to a MTJ by controlling a level of the driving current or an active period of a word line that controls a switching circuit for forming a current path of a memory cell in a data writing operation according to temperature.

In accordance with an aspect of the present invention, there is provided a semiconductor memory device including: a memory cell connected between a first driving line and a second driving line and configured to store data having a data state that is determined based on a direction of a current flowing through the first and the second driving lines; and a current controlling block configured to control a supply current provided to the first and second driving lines in response to temperature information in a writing operation.

In accordance with another aspect of the present invention, there is provided a semiconductor memory device including: a memory cell connected between a first driving line and a second driving line and configured to store data having a data state that is determined based on a direction of a current flowing through the first and the second driving lines; a write driving block configured to drive the first and second driving lines in response to input data in a writing operation; and a voltage controlling block configured to control a supply voltage provided to the write driving block in response to temperature information.

In accordance with another aspect of the present invention, there is provided a semiconductor memory device including: a memory cell connected between a first driving line and a second driving line and configured to store data having a data state that is determined based on a direction of a current flowing through the first and the second driving lines; a write driving block configured to drive one of the first and second driving lines corresponding to input data with a first supply voltage in a writing operation; and an additional write driving block configured to additionally drive one of the first and second driving lines corresponding to the data with a second supply voltage in response to temperature information.

In accordance with another aspect of the present invention, there is provided a semiconductor memory device including: a storage element configured to store data having a data state that is determined based on a direction of a current flowing through its current path; a switching element configured to form a current path including the storage element and first and second driving lines during an active period of a word line; and a driving current controlling block configured to control an amount of a driving current flowing through the first and second driving lines by controlling the switching element according to temperature information.

The semiconductor memory device in accordance with the embodiments of the present invention can adjust the switching current applied to the semiconductor memory device by controlling an amount of the driving current flowing to the MTJ or the supply voltage provided to the MTJ in the data writing operation according to the temperature. Furthermore, the semiconductor memory device can secure the desired stable data writing operation through the above adjustment of the switching current.

DESCRIPTION OF SPECIFIC EMBODIMENTS

Other objects and advantages of the present invention can be understood by the following description, and become apparent with reference to the embodiments of the present invention.

Figure 1:
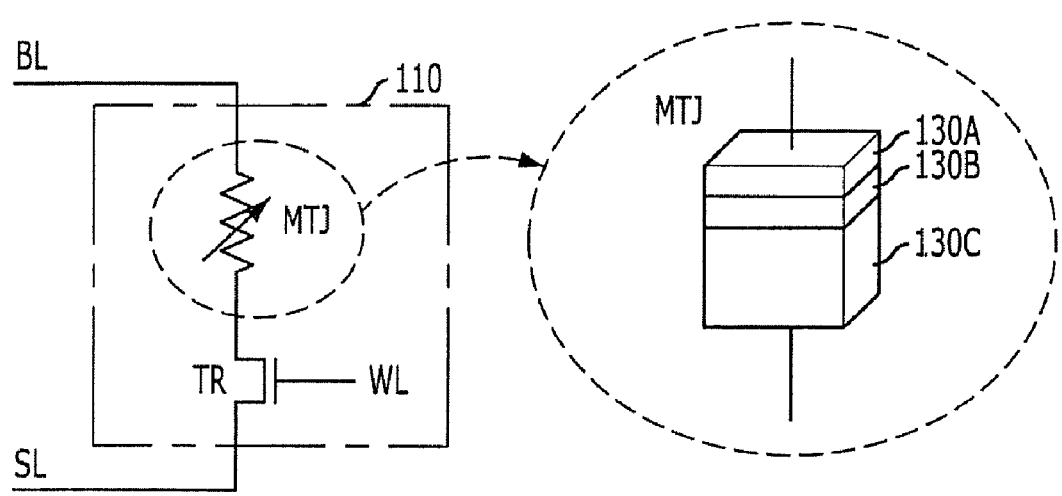
FIG. 1 illustrates a structure of a memory cell of a typical semiconductor memory device.
Figure 2A:
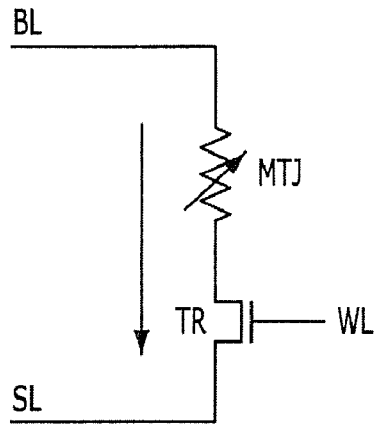
FIGS. 2A and 2B illustrate views for explaining a data writing operation of a MTJ described in FIG. 1.
Figure 2B:
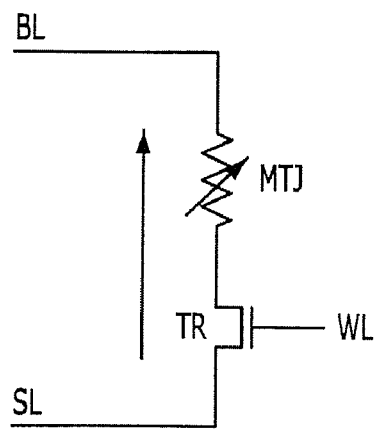
Figure 3:
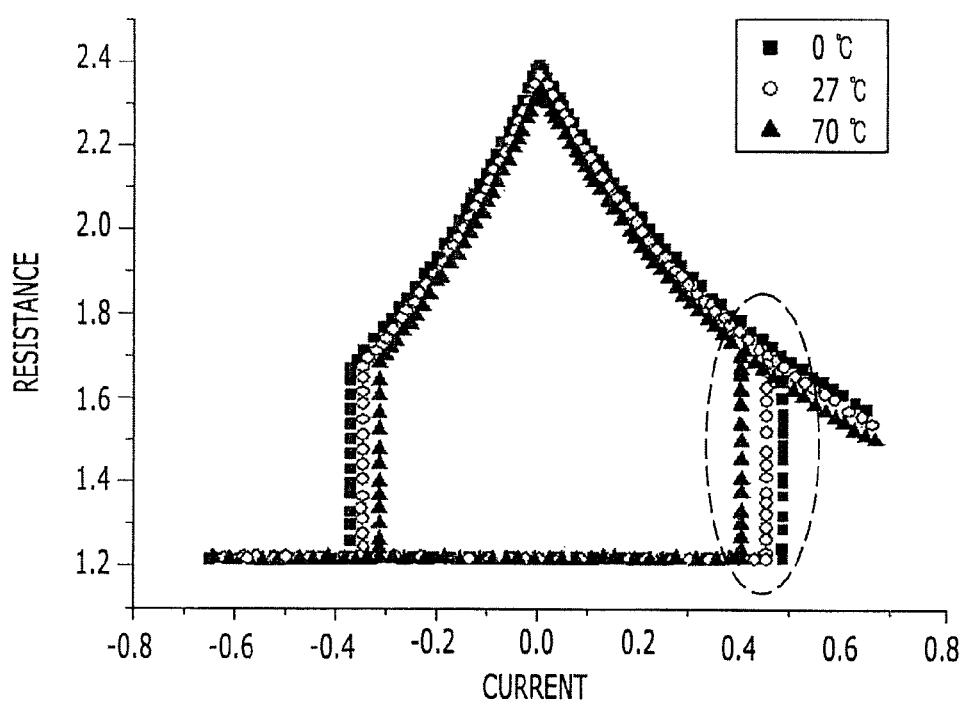
FIG. 3 illustrates a graph showing a tunnel magneto-resistance (TMR) characteristic according to temperature and voltage of the MTJ illustrated in FIG. 1.
Figure 4:
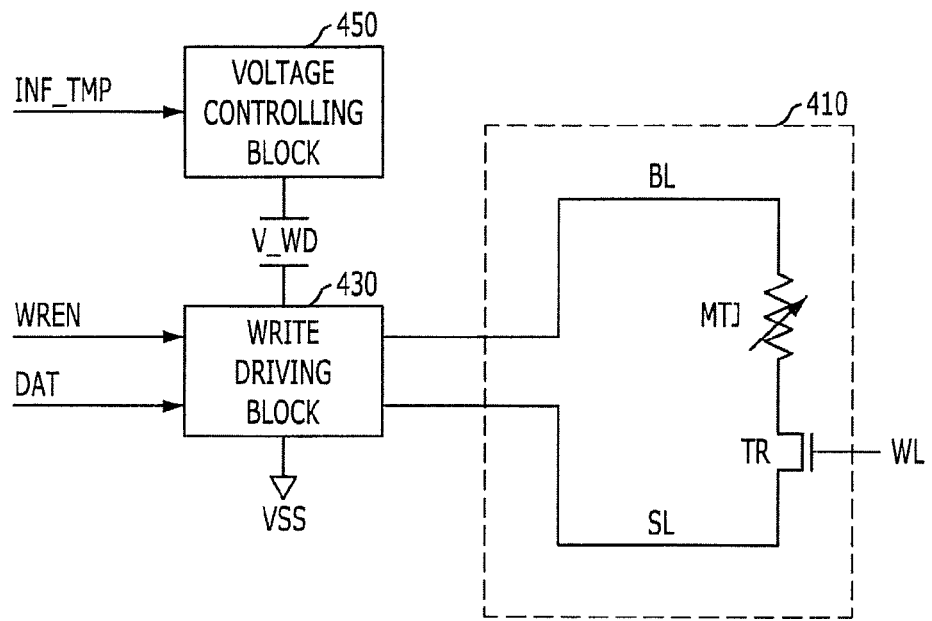
FIG. 4 illustrates a block diagram of a semiconductor memory device in accordance with a first embodiment of the present invention.

FIG. 4 illustrates a block diagram of a semiconductor memory device in accordance with a first embodiment of the present invention.

Referring to FIG. 4, the semiconductor memory device includes a memory cell 410, a write driving block 430 and a voltage controlling block 450.

The memory cell 410 stores data having a data state that is determined based on a direction of a current flowing through a bit line BL and a source line SL and thus includes a magnetic tunnel junction element MTJ and a switching element TR that are serially connected between the bit line BL and the source line SL.

The write driving block 430 drives the bit line BL and the source line SL in response to input data DAT in a writing operation and thus drives corresponding lines with a write supply voltage V_WD or a ground voltage VSS by receiving a write enable signal WREN and the input data DAT. In other words, in case where the input data DAT is '0', the write driving block 430 drives the bit line BL with the write supply voltage V_WD and the source line SL with the ground voltage VSS. On the other hand, in case where the input data DAT is '1', the write driving block 430 drives the bit line BL with the ground voltage VSS and the source line SL with the write supply voltage V_WD. Herein, the write enable signal WREN may be enabled in the write operation of the semiconductor memory device.

The voltage controlling block 450 controls the write supply voltage V_WD that is a supply voltage provided to the write driving voltage 430 in response to temperature information INF_TMP. The write supply voltage V_WD in accordance with the present invention has a voltage level that is determined based on the temperature information INF_TMP. Herein, the temperature information INF_TMP may be an analog signal or a digital signal according to different design needs. Hereinafter, for illustration purposes, the case where the temperature information INF_TMP is the digital signal will be described as an example.

Figure 5:
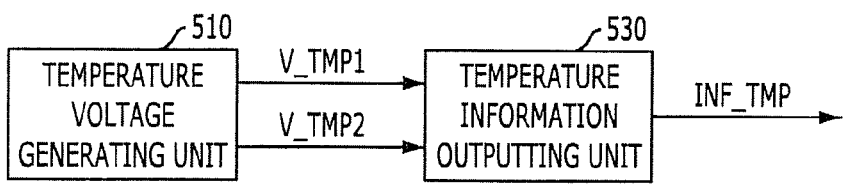
FIG. 5 illustrates a block diagram of a temperature information generating block for outputting temperature information of FIG. 4.

FIG. 5 illustrates a block diagram of a temperature information generating block for outputting the temperature information INF_TMP of FIG. 4.

Referring to FIG. 5, the temperature information generating block generates the temperature information INF_TMP varying according to the temperature of the semiconductor memory device, and includes a temperature voltage generating unit 510 and a temperature information outputting unit 530.

The temperature voltage generating unit 510 produces a first temperature voltage V_TMP1 having a voltage level that is determined based on the temperature and a second temperature voltage V_TMP2 having a predetermined voltage level.

The temperature information outputting unit 530 outputs the temperature information INF_TMP of a logic high or a logic low according to the voltage levels of the first and second temperature voltages V_TMP1 and V_TMP2. The relationship of the temperature information INF_TMP and the first and second temperature voltages V_TMP1 and V_TMP2 according to the temperature will be described again with reference to FIG. 7. The temperature information INF_TMP in accordance with the embodiment of the present invention has the logic low in case where the temperature applied to the semiconductor memory device is relatively low, while it has the logic high in case where the temperature applied to the semiconductor memory device is relatively high (for example, higher than the relatively low temperature).

Figure 6:
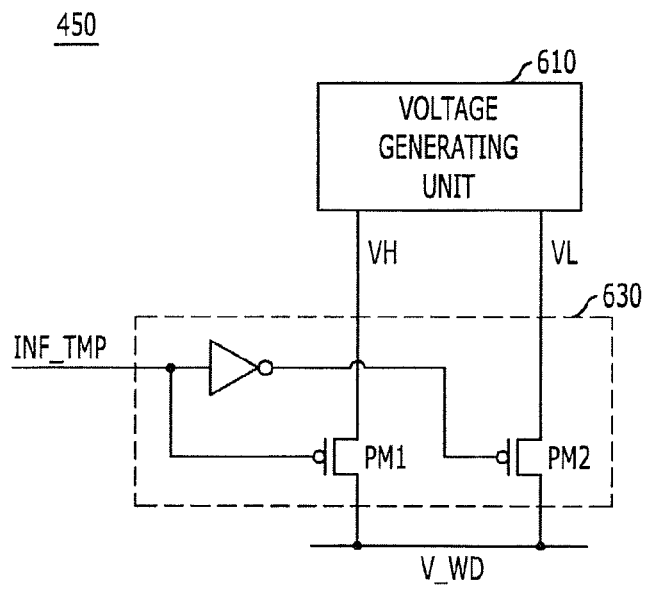
FIG. 6 illustrates a view for explaining a voltage controlling block in FIG. 4.

FIG. 6 illustrates a view for explaining the voltage controlling block 450 described in FIG. 4.

Referring to FIG. 6, the voltage controlling block 450 includes a voltage generating unit 610 for producing first and second voltages VH and VL having voltage levels corresponding to the temperature information INF_TMP and a driving unit 630 for driving a write supply voltage (V_WD) terminal with the first or second voltage VH or VL in response to the temperature information INF_TMP. Herein, the first and second voltages VH and VL have different voltage levels from each other and will be described again with reference to FIG. 7.

Meanwhile, the driving unit 630 includes a first PMOS transistor PM1 for driving the V_WD terminal with the first voltage VH in response to the temperature information INF_TMP and a second PMOS transistor PM2 for driving the V_WD terminal with the second voltage VL in response to the temperature information INF_TMP.

Herein, the first PMOS transistor PM1 includes a source-drain path formed between a first voltage (VH) node and the V_WD terminal and a gate receiving the temperature information INF_TMP, and the second PMOS transistor PM2 includes a source-drain path formed between a second voltage (VL) node and the V_WD terminal and a gate receiving an inverted signal of the temperature information INF_TMP. This operation will be described with reference to FIG. 7 hereinafter.

Figure 7:
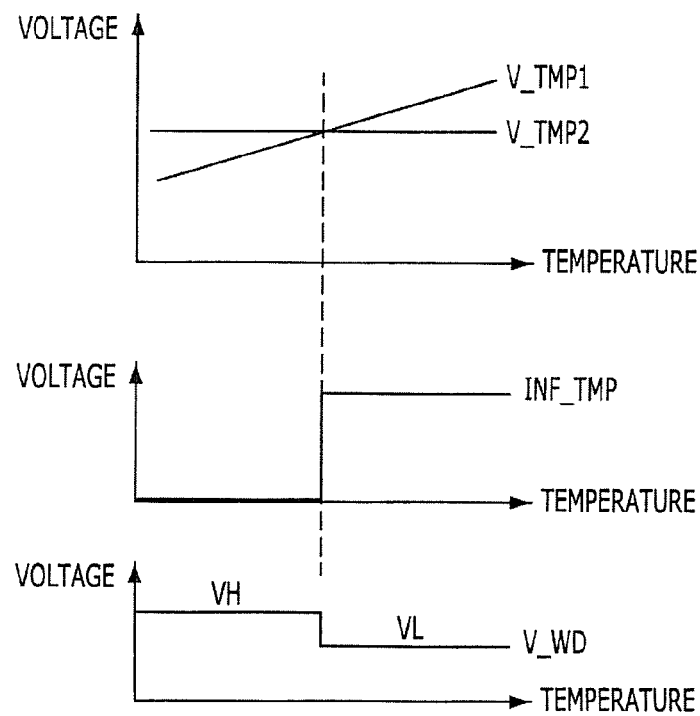
FIG. 7 illustrates a waveform diagram for explaining schematic operations of the temperature information generating block illustrated in FIG. 5 and the voltage controlling block described in FIG. 6.

FIG. 7 illustrates a waveform diagram for explaining schematic operations of the temperature information generating block described in FIG. 5 and the voltage controlling block 450 described in FIG. 6.

Referring to FIGS. 4 to 7, the temperature voltage generating unit 510 produces the first temperature voltage V_TMP1 increasing as the temperature rises and the second temperature voltage V_TMP2 maintaining a constant voltage level regardless of the temperature. The temperature information outputting unit 530 compares the first temperature voltage V_TMP1 and the second temperature voltage V_TMP2 to output the comparison result as the temperature information INF_TMP. Therefore, the temperature information INF_TMP has the logic low in a period where the temperature applied to the semiconductor memory device is relatively low and the logic high in a period where the temperature is relatively high.

In the meantime, the voltage controlling block 450 drives the V_WD terminal with the first voltage VH having a relatively high voltage level or the second voltage VL having a relatively low voltage level in response to the temperature information INF_TMP. That is, in the construction of the driving unit 630, in case where the temperature information INF_TMP has the logic low, the first PMOS transistor PM1 is turned on and thus the V_WD terminal is driven with the first voltage VH, whereas, in case where the temperature information INF_TMP has the logic high, the second PMOS transistor PM2 is turned on and thus the V_WD terminal is driven with the second voltage VL.

Figure 8:
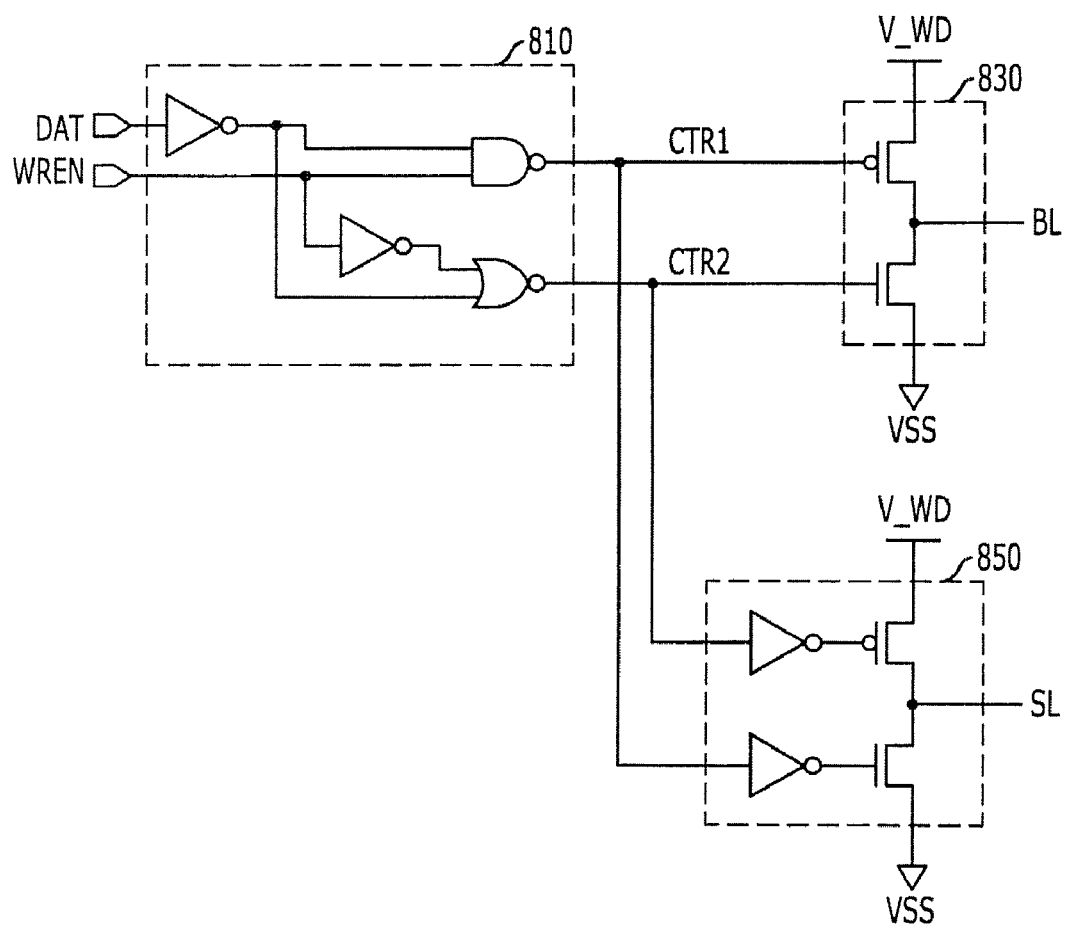
FIG. 8 illustrates a circuit diagram of a write driving block in FIG. 4.

FIG. 8 illustrates a circuit diagram of the write driving block 430 in FIG. 4.

Referring to FIG. 8, the write driving block 430 includes a control signal generating unit 810 for producing first and second driving control signals CTR1 and CTR2 in response to the input data DAT and the write enable signal WREN, and first and second line driving units 830 and 850 for driving the bit line BL and the source line SL in response to the first and second driving control signals CTR1 and CTR2, respectively. Herein, the first and second line driving units 830 and 850 receive the write supply voltage V_WD generated in accordance with the present invention and drive their corresponding lines with the write supply voltage V_WD or the ground voltage VSS in response to the first and second driving control signals CTR1 and CTR2 corresponding to the write enable signal WREN and the input data DAT.

The semiconductor memory device in accordance with the first embodiment of the present invention can adjust the supply voltage provided to the V_WD terminal according to the temperature information INF_TMP. Therefore, in the first embodiment, when the write driving block 430 drives the bit line BL or the source line SL according to the input data DAT in the active period of the write enable signal WREN, it is possible to use the write supply voltage V_WD whose voltage level is adjusted according to the temperature information INF_TMP. Herein, by being able to adjust the write supply voltage V_WD used in driving the bit line BL and the source line SL according to the temperature, a supply current provided to the magnetic tunnel junction element MTJ can be adjusted. In other words, in case where the temperature is relatively low, it is possible to increase the supply current provided to the magnetic tunnel junction element MTJ by increasing the voltage level of the write supply voltage V_WD. In case where the temperature is relatively high, it is possible to decrease the supply current provided to the magnetic tunnel junction element MTJ by decreasing the voltage level of the write supply voltage V_WD.

After all, the voltage controlling block 450 controls the supply current provided to the bit line BL and the source line SL according to the temperature information INF_TMP. Herein, the voltage controlling block 450 acts as a circuit for controlling the supply current for the bit line BL and the source line SL.

Figure 9:
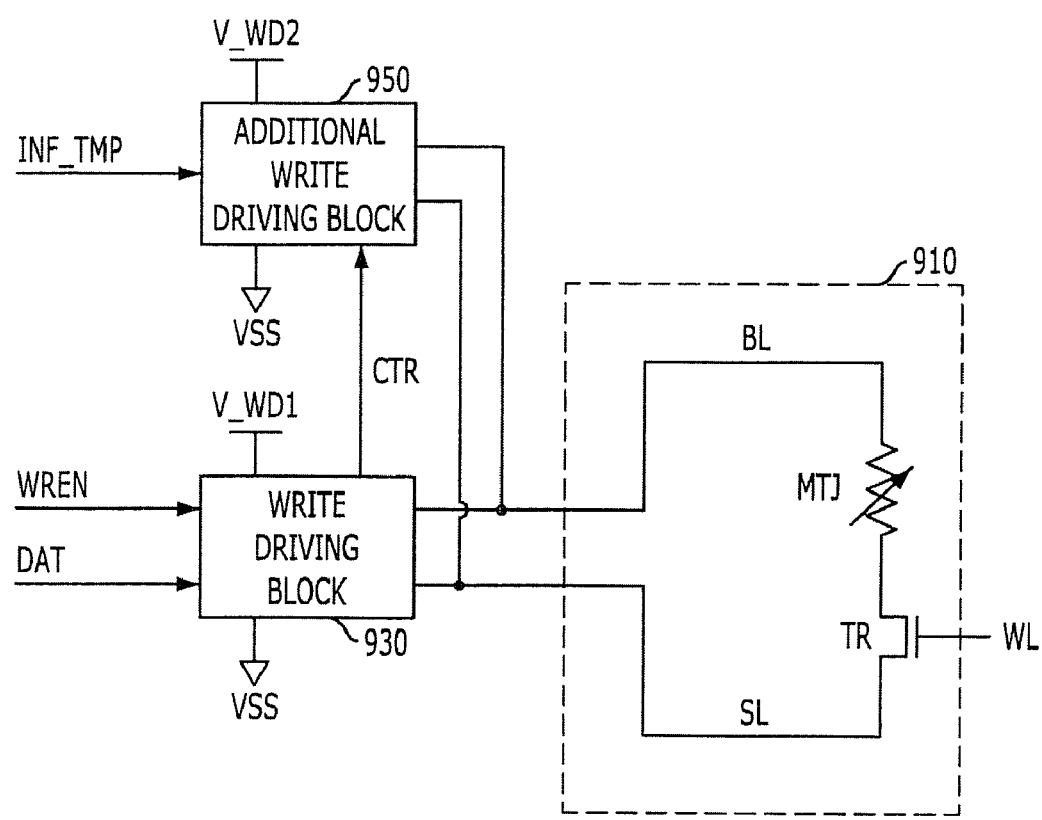
FIG. 9 illustrates a block diagram of a semiconductor memory device in accordance with a second embodiment of the present invention.

FIG. 9 illustrates a block diagram of a semiconductor memory device in accordance with a second embodiment of the present invention.

Referring to FIG. 9, the semiconductor memory device includes a memory cell 910, a write driving block 930 and an additional write driving block 950. For illustration purposes, the case that temperature information INF_TMP of the second embodiment is a digital signal as in the first embodiment is described as an example.

The memory cell 910 stores data having a data state that is determined based on a direction of a current flowing through a bit line BL and a source line SL and thus includes a magnetic tunnel junction element MTJ and a switching element TR that are serially connected between the bit line BL and the source line SL.

The write driving block 930 drives one of the bit line BL and the source line SL corresponding to input data DAT with a first supply voltage V_WD1 or the ground voltage VSS in a writing operation. The write driving block 930 drives the bit line BL with the first supply voltage V_WD1 and the source line SL with the ground voltage VSS in case where the input data is '0' for the write driving block 430 in the first embodiment. On the other hand, the write driving block 930 drives the bit line BL with the ground voltage VSS and the source line SL with the first supply voltage V_WD1 in case where the input data is '1'.

The additional write driving block 950 additionally drives one of the bit line BL and the source line SL corresponding to a driving control signal CTR with a second supply voltage V_WD2 in response to the temperature information INF_TMP. Herein, the driving control signal CTR is a signal corresponding to the input data DAT and will be described again with reference to FIG. 10.

In the semiconductor memory device in accordance with the second embodiment of the present invention, it is possible that the write driving block 930 drives the bit line BL and the source line SL according to the input data DAT and the additional write driving block 950 additionally drives the bit line BL and the source line SL according to the temperature information INF_TMP and the input data DAT. Accordingly, a supply current provided to the bit line BL and the source line SL can be controlled according to whether the additional write driving block 950 operates or not. In the second embodiment of the present invention, although the bit line BL and the source line SL are additionally driven with the second supply voltage V_WD2, it is also possible to drive the bit line BL and the source line SL with the ground voltage VSS according to different design needs.

Figure 10:
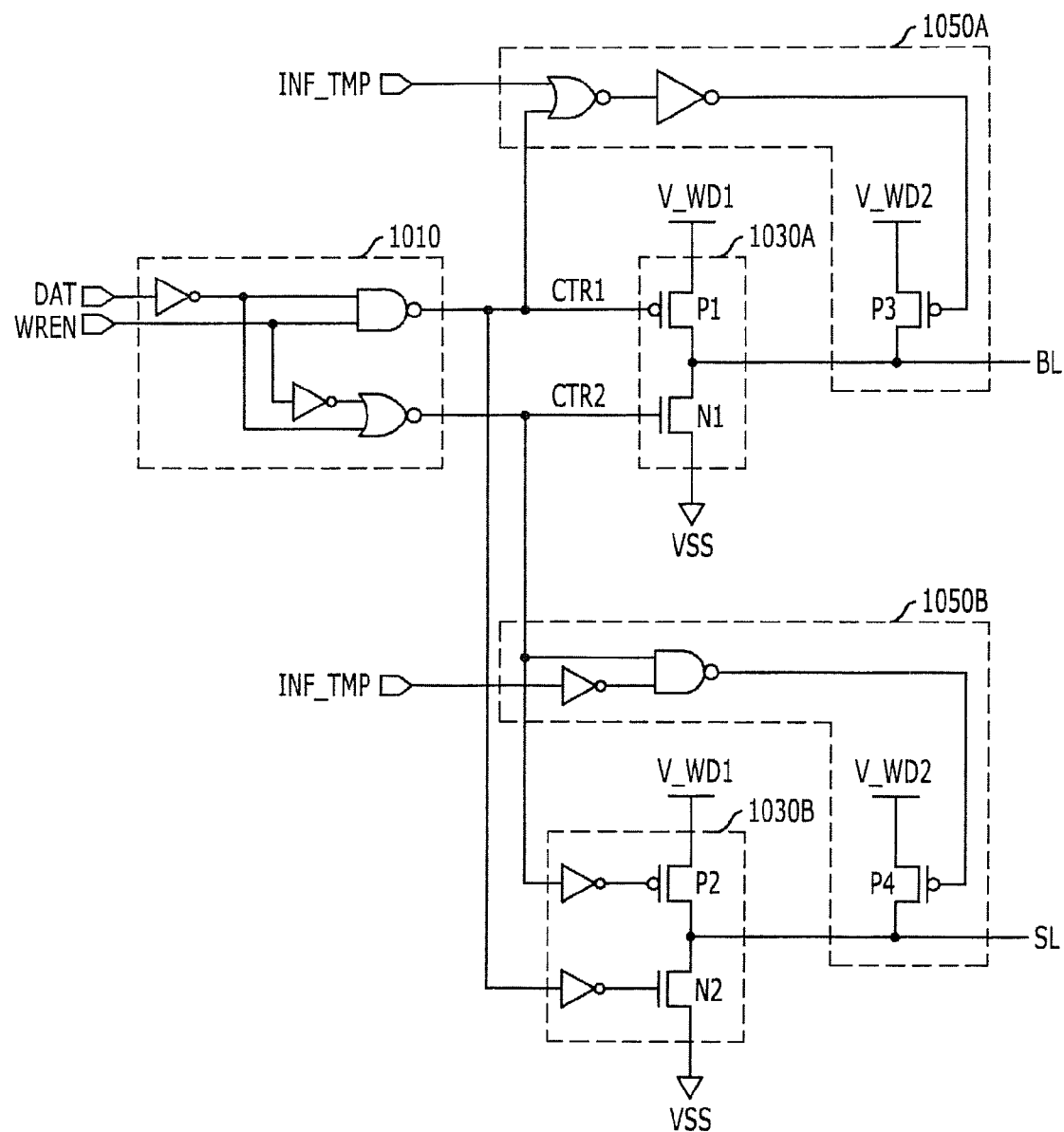
FIG. 10 illustrates a circuit diagram of a write driving block and an additional write driving block described in FIG. 9.

FIG. 10 illustrates a circuit diagram of the write driving block 930 and the additional write driving block 950 described in FIG. 9.

Referring to FIGS. 9 and 10, the write driving block 930 includes a control signal generating unit 1010, a bit line driving unit 1030A and a source line driving unit 1030B.

The control signal generating unit 1010 produces first and second driving control signals CTR1 and CTR2 in response to a write enable signal WREN and the input data DAT. At this point, the first and second driving control signals CTR1 and CTR2 have logic levels corresponding to the input data DAT in a period where the write enable signal WREN is enabled to a logic high. That is, the first and second driving control signals CTR1 and CTR2 have a logic low in case where the input data DAT is '0', whereas the first and second driving control signals CTR1 and CTR2 have a logic high in case where the input data DAT is '1'.

The bit line driving unit 1030A includes a first PMOS transistor P1 and a first NMOS transistor N1 serially connected between the first supply voltage V_WD1 and the ground voltage VSS. The first PMOS transistor P1 receives the first driving control signal CTR1 through its gate and the first NMOS transistor N1 receives the second driving control signal CTR2 through its gate. A common node of the first PMOS transistor P1 and the first NMOS transistor N1 is connected to the bit line BL and the bit line BL is driven with the first supply voltage V_WD1 or the ground voltage VSS in response to the first and second driving control signals CTR1 and CTR2.

The source line driving unit 1030B includes a second PMOS transistor P2 and a second NMOS transistor N2 serially connected between the first supply voltage V_WD1 and the ground voltage VSS.

The second PMOS transistor P2 receives an inverted signal of the second driving control signal CTR2 through its gate and the second NMOS transistor N2 receives an inverted signal of the first driving control signal CTR1 through its gate. A common node of the second PMOS transistor P2 and the second NMOS transistor N2 is connected to the source line SL and the source line SL is driven with the first supply voltage V_WD1 or the ground voltage VSS in response to the first and second driving control signals CTR1 and CTR2.

Meanwhile, the additional write driving block 950 includes a bit line additional driving unit 1050A and a source line additional driving unit 1050B. For illustration purposes, a second supply voltage V_WD2 may have a voltage level equal to or different from that of the first supply voltage V_WD1.

The bit line additional driving unit 1050A drives the bit line BL with the second supply voltage V_WD2 in response to the temperature information INF_TMP and the first driving control signal CTR1, and includes a third PMOS transistor P3 that has a source-drain path formed between the second supply voltage V_WD2 and the bit line BL and a gate receiving a signal corresponding to the temperature information INF_TMP and the first driving control signal CTR1.

The source line additional driving unit 1050B drives the source line SL with the second supply voltage V_WD2 in response to the temperature information INF_TMP and the second driving control signal CTR2, and includes a fourth PMOS transistor P4 that has a source-drain path formed between the second supply voltage V_WD2 and the source line SL and a gate receiving a signal corresponding to the temperature information INF_TMP and the second driving control signal CTR2.

The second embodiment of the present invention illustrates that the temperature information INF_TMP may be a digital signal as shown in FIG. 7. That is, the temperature information INF_TMP becomes the logic low in case where the temperature applied to the semiconductor memory device is relatively low, whereas the temperature information INF_TMP becomes the logic high in case where the temperature applied to the semiconductor memory device is relatively high. Therefore, the bit line additional driving unit 1050A and the source line additional driving unit 1050B are activated when the temperature is relatively low, and the bit line BL and the source line SL are additionally driven with the second supply voltage V_WD2 according to the input data DAT.

Hereinafter, operations of the write driving units 1010, 1030A and 1030B and the additional write driving units 1050A and 1050B will be briefly described.

The write enable signal WREN of the semiconductor memory device becomes a logic high in the writing operation. At this time, in case where the temperature applied to the semiconductor memory device is relatively low, the temperature information INF_TMP becomes the logic low, and thus the bit line additional driving unit 1050A and the source line additional driving unit 1050B are activated. Therefore, the bit line driving unit 1030A and the bit line additional driving unit 1050A, and the source line driving unit 1030B and the source line additional driving unit 1050B drive the bit line BL and the source line SL with corresponding supply voltages according to the input data DAT. That is, in case where the input data is '0', the bit line BL is driven with the first and second supply voltages V_WD1 and V_WD2. In case where the input data is '1', the source line SL is driven with the first and second supply voltages V_WD1 and V_WD2.

In the meantime, in case where the temperature applied to the semiconductor memory device is relatively high, the temperature information INF_TMP becomes the logic high, and thus the bit line additional driving unit 1050A and the source line additional driving unit 1050B are deactivated. Namely, in case where the input data is '0', the bit line BL is driven with the first supply voltage V_WD1. In case where the input data is '1', the source line SL is driven with the first supply voltage V_WD1.

With the supply voltage for driving the bit line BL and the source line SL being changed according to the temperature information INF_TMP, the supply current provided to the memory cell 910, referring to FIG. 9, connected between the bit line BL and the source line SL is changed according to the temperature information INF_TMP. That is, in accordance with the second embodiment of the present invention, as in the first embodiment, it is possible to control the supply current provided to the bit line BL and the source line SL according to the temperature information INF_TMP. Herein, the additional write driving block 950 acts as a circuit for controlling the supply current from viewpoints of the bit line BL and the source line SL.

Figure 11:
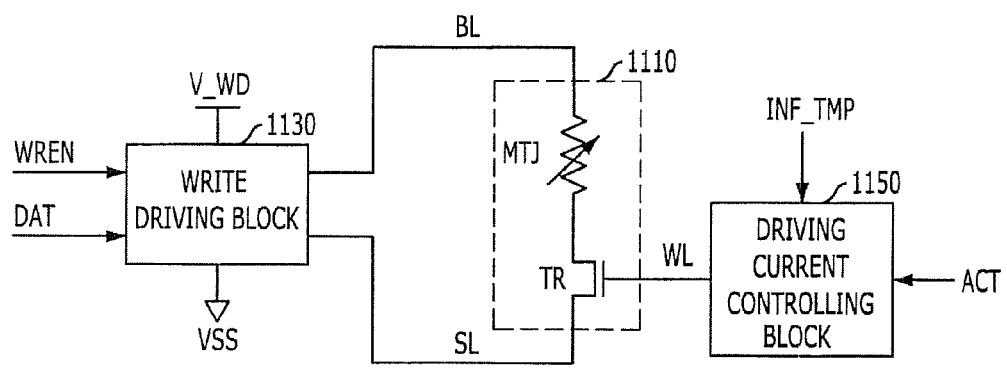
FIG. 11 illustrates a block diagram of a semiconductor memory device in accordance with a third embodiment of the present invention.

FIG. 11 illustrates a block diagram of a semiconductor memory device in accordance with a third embodiment of the present invention. Referring to FIG. 11, the semiconductor memory device includes a memory cell 1110, a write driving block 1130 and a driving current controlling block 1150.

The memory cell 1110 includes a magnetic tunnel junction element MTJ and a switching element TR. The magnetic tunnel junction element MTJ is a storage element for storing data having a data state that is determined based on a direction of a current flowing through a bit line BL and a source line SL. The switching element TR forms a current path through the bit line BL, the magnetic tunnel junction element MTJ and the source line SL during an active period of a word line WL.

The write driving block 1130 drives the bit line BL and the source line SL in response to a write enable signal WREN and input data DAT. The bit line BL and the source line SL are respectively driven with a write supply voltage V_WD or a ground voltage VSS according to the input data DAT. According to an operation of the write driving block 1130, data corresponding to the input data DAT is stored in the memory cell 1110.

The driving current controlling block 1150 controls the switching element TR according to an active command ACT and temperature information INF_TMP to thereby control an amount of a driving current flowing through the bit line BL and the source line SL. The driving current controlling block 1150 in accordance with the third embodiment of the present invention can control the amount of the driving current flowing through the bit line BL and the source line SL by adjusting an active period or current driving capacity of the switching element TR according to the temperature applied to the semiconductor memory device in the active operation. Hereinafter, various construction of the driving current controlling block 1150 will be described with reference to FIGS. 12 and 13.

Figure 12:
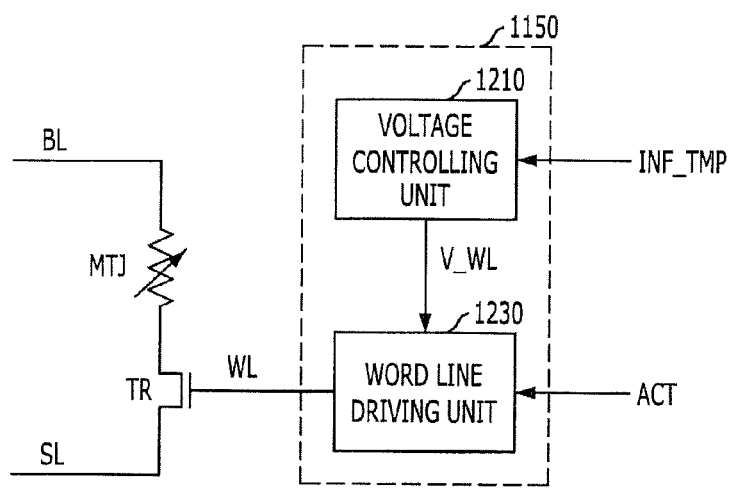
FIGS. 12 and 13 illustrate block diagrams for explaining a driving current controlling block in FIG. 11.
Figure 13:
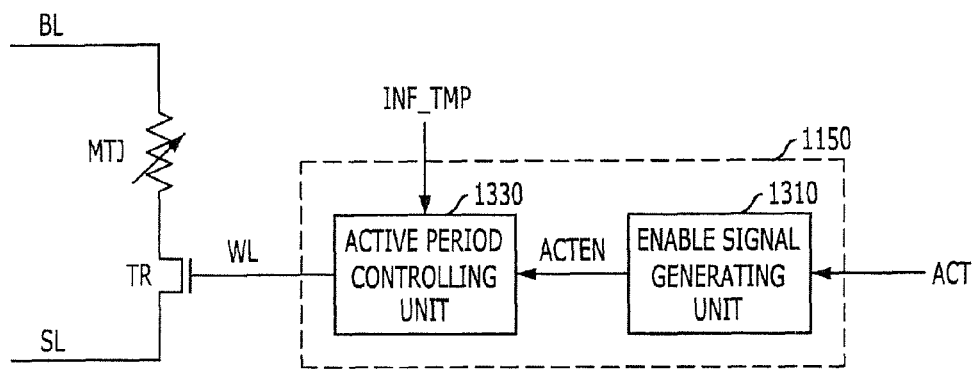

FIGS. 12 and 13 illustrate block diagrams for explaining the driving current controlling block 1150 in FIG. 11.

Referring to FIG. 12, the driving current controlling block 1150 controls the current driving capacity of the switching element TR in response to the temperature information INF_TMP. Thus, the driving current controlling block 1150 includes a voltage controlling unit 1210 for controlling a driving supply voltage V_WL provided to a word line driving unit 1230 according to the temperature information INF_TMP, and the word line driving unit 1230 for driving the word line WL with the driving supply voltage V_WL in response to the active command ACT. Herein, the active command ACT is enabled in an active operation and the word line WL is activated in response to the active command ACT. For illustration purposes, the word line driving unit 1230 activates the switching element TR for a predetermined time corresponding to a period where the active command ACT is enabled.

In the driving current controlling block 1150 described in FIG. 12, a voltage level of the driving supply voltage V_WL is changed according to the temperature information INF_TMP. That is, in case where the temperature applied to the semiconductor memory device is relatively low, the voltage level of the driving supply voltage V_WL becomes higher, whereas, in case where the temperature applied to the semiconductor memory device is relatively high, the voltage level of the driving supply voltage V_WL becomes lower. As in the driving current controlling block 1150 in FIG. 12, if the voltage level of the driving supply voltage V_WL is changed according to the temperature information INF_TMP, a voltage level of the driving voltage of the word line WL activated for the predetermined time is also changed. The voltage level of the driving voltage of the word line WL determines the current driving capacity of the switching element TR. That is, it is possible to adjust the amount of the driving current flowing through the bit line BL, the magnetic tunnel junction element MTJ and the source line SL by determining the extent of the turning-on of the switching element TR. After all, the amount of the driving current flowing through the magnetic tunnel junction element MTJ may be changed according to the temperature.

In the meantime, referring to FIG. 13, the driving current controlling block 1150 adjusts an active period of the switching element TR in response to the temperature information INF_TMP. The driving current controlling block 1150 includes an enable signal generating unit 1310 for producing an active enable signal ACTEN that is enabled during a predetermined period in response to the active command ACT, and an active period controlling unit 1330 for controlling an active period of the active enable signal ACTEN in response to the temperature information INF_TMP. As a result of the driving current controlling block 1150 described in FIG. 13, an active period of the word line WL is changed according to the temperature information INF_TMP.

Figure 14:
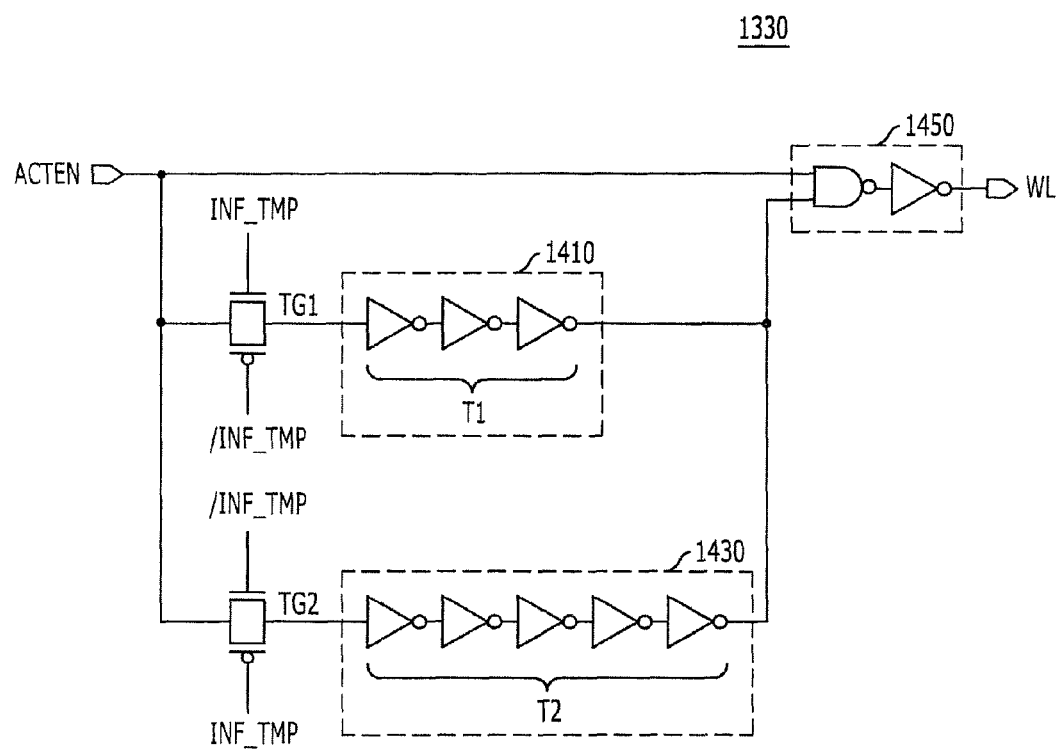
FIG. 14 illustrates a circuit diagram of an active period controlling unit in FIG. 13.

FIG. 14 illustrates a circuit diagram of the active period controlling unit 1330 in FIG. 13.

Referring to FIG. 14, the active period controlling unit 1330 includes a first delay part 1410 for receiving the active enable signal ACTEN in case where first transmission part TG1 is activated, a second delay part 1430 for receiving the active enable signal ACTEN in case where second transmission gate TG2 is activated, and an outputting part 1450 for outputting a signal corresponding to output signals of the first and second delay parts 1410 and 1430 to the word line WL. Herein, the enablement of the first transmission part TG1 or the second transmission part TG2 is determined in response to the temperature information INF_TMP and /INF_TMP, and the first and second transmission parts TG1 and TG2 reflect different delay amounts T1 and T2 in response to the active enable signal ACTEN inputted thereto, respectively.

In case where the temperature applied to the semiconductor memory device is relatively high, since the temperature information INF_TMP becomes a logic high and the inverted temperature information /INF_TMP becomes a logic low, the active enable signal ACTEN is inputted to the first delay part 1410. Meanwhile, in case where the temperature applied to the semiconductor memory device is relatively low, since the temperature information INF_TMP becomes the logic low and the inverted temperature information /INF_TMP becomes the logic high, the active enable signal ACTEN is inputted to the second delay part 1430. Herein, in case where the temperature information INF_TMP is an analog signal, the construction of the active period controlling unit 1330 may be changed accordingly. In this case, the active period controlling unit 1330 may include a delay circuit for reflecting a delay time corresponding to the temperature information INF_TMP to the active enable signal ACTEN and an output circuit for outputting a signal to activate the word line WL during the delay time.

Figure 15:
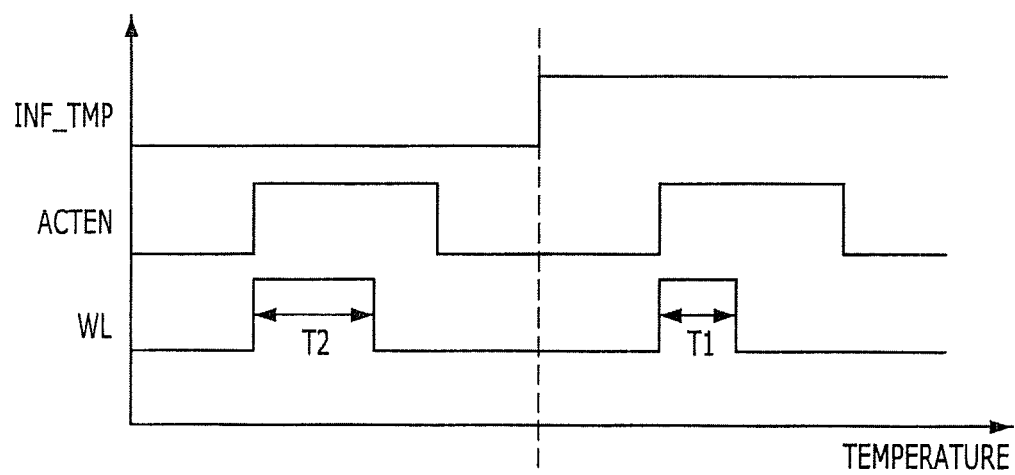
FIG. 15 illustrates a waveform diagram for explaining an operation of the active period controlling unit in FIG. 14.

FIG. 15 illustrates a waveform diagram for explaining an operation of the active period controlling unit 1330 in FIG. 14. For illustration purposes, the temperature information INF_TMP of FIG. 15 uses as an example a signal that transits to a logic low or a logic high in response to the second temperature voltage V_TMP2 having the predetermined voltage level as in FIG. 7.

Referring to FIGS. 14 and 15, in case where the temperature applied to the semiconductor memory device is relatively low, i.e., the temperature information INF_TMP has the logic low, the second transmission part TG2 is turned on and thus the delay time T2 corresponding to the second delay part 1430 is reflected at the active enable signal ACTEN. Therefore, the signal outputted to the word line WL from the outputting part 1450 has a pulse width corresponding to the delay time T2. Herein, the pulse width corresponding to the delay time T2 means activating the switching element TR of FIG. 13 for a longer time in case where the temperature applied to the semiconductor memory device is relatively low. This means increasing the amount of the driving current flowing through the magnetic tunnel junction element MTJ.

Then, in case where the temperature applied to the semiconductor memory device is relatively high, i.e., the temperature information INF_TMP has the logic high, the first transmission part TG1 is turned on and thus the delay time T1 corresponding to the second delay part 1410 is reflected at the active enable signal ACTEN. Therefore, the signal outputted to the word line WL has a pulse width corresponding to the delay time T1. This means reducing the amount of the driving current flowing through the magnetic tunnel junction element MTJ.

The semiconductor memory device in accordance with the third embodiment of the present invention described in FIGS. 11 to 14 can control the amount of the driving current flowing through the magnetic tunnel junction element MTJ by controlling the current driving capacity or the active period of the switching element TR according to the temperature information INF_TMP.

As described above, the semiconductor memory devices in accordance with the first to third embodiments of the present invention can control the supply current provided to the magnetic tunnel junction element MTJ or the amount of the driving current flowing through the magnetic tunnel junction element MTJ according to the temperature. This means that the switching current of the magnetic tunnel junction element MTJ can be adjusted according to different device characteristics. Therefore, it is possible to secure the stable writing operation and the improvement of the problems due to the PVT. Moreover, in accordance with the present invention, it is possible to minimize the power consumption required when storing data in the magnetic tunnel junction element MTJ.

In accordance with the present invention, it is possible to secure the stable writing operation of desired data although the temperature is changed, by controlling the switching current of the magnetic tunnel junction element MTJ according to the temperature applied to the semiconductor memory device.

Furthermore, in accordance with the present invention, it is possible to secure the stable writing operation of input data even if the variation due to the PVT occurs in the semiconductor memory device.

Moreover, in accordance with the present invention, it is possible to minimize the power consumption required for the storage of data by controlling the switching current of the magnetic tunnel junction element MTJ according to the temperature.

While the present invention has been described with respect to the specific embodiments, it will be apparent to those skilled in the art that various changes and modifications may be made without departing from the spirit and scope of the invention as defined in the following claims.

For instance, in the above embodiments, the illustrated logic gates and transistors may be implemented to have different locations and types according to polarities of signals inputted thereto.

What is claimed is:
1. A semiconductor memory device, comprising:
a memory cell connected between a first driving line and a second driving line and configured to store data having a data state determined based on a direction of a current flowing through the first and the second driving lines;
a current controlling block configured to control a supply current provided through the first and second driving lines in response to temperature information in a writing operation; and a temperature information generating block configured to produce the temperature information, wherein the temperature information varies according to a variation in temperature, wherein the temperature information generating block comprises:

a temperature voltage generating unit configured to produce a first temperature voltage having a voltage level that varies in response to the temperature variation and a second temperature voltage having a constant voltage level in response to the temperature variation; and a temperature information outputting unit configured to output the temperature information in response to the first and second temperature voltages.

2. The semiconductor memory device of claim 1, wherein the memory cell comprises:

a storage element configured to store resistance according to a direction of a current flowing through its current path; and a switching element configured to form a current path through the storage element and the first and second driving lines during an active period of a word line.

3. The semiconductor memory device of claim 2, wherein the storage element comprises a magnetic tunnel junction device.

4. The semiconductor memory device of claim 1, further comprising a write driving block configured to drive the first and second driving lines with corresponding supply voltages in response to input data in the writing operation.

5. A method for controlling a semiconductor memory device having a memory cell connected between a first driving line and a second driving line and configured to store data having a data state determined based on a direction of a current flowing through the first and the second driving lines, comprising:

producing a first temperature voltage having a voltage level that varies in response to a variation in temperature and a second temperature voltage having a constant voltage level in response to the temperature variation;

outputting temperature information in response to the first and second temperature voltages; and controlling a supply current provided through the first and second driving lines in response to the temperature information in a writing operation.

* * * * *